(12) United States Patent
Chae et al.

(10) Patent No.: US 7,403,429 B2
(45) Date of Patent: Jul. 22, 2008

(54) METHOD OF ERASING DATA WITH IMPROVING RELIABILITY IN A NONVOLATILE SEMICONDUCTOR MEMORY DEVICE

(75) Inventors: Dong-Hyuk Chae, Seoul (KR); Young-Ho Lim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/548,630

(22) Filed: Oct. 11, 2006

(65) Prior Publication Data
US 2007/0133305 A1   Jun. 14, 2007

(30) Foreign Application Priority Data
Nov. 8, 2005   (KR) .................. 10-2005-0106442

(51) Int. Cl.
*G11C 11/34* (2006.01)
(52) U.S. Cl. ........................ 365/185.29; 365/185.24
(58) Field of Classification Search ............ 365/185.29, 365/185.24
See application file for complete search history.

(56) References Cited

U.S. PATENT DOCUMENTS

| | | | | |
|---|---|---|---|---|
| 5,661,682 A * | 8/1997 | Lim et al. | ............... | 365/185.17 |
| 5,973,962 A * | 10/1999 | Kwon | .................... | 365/185.18 |
| 6,285,587 B1 | 9/2001 | Kwon | | |
| 6,594,178 B2 * | 7/2003 | Choi et al. | ............. | 365/185.17 |
| 6,809,951 B2 * | 10/2004 | Yamaguchi | .................. | 365/145 |
| 7,230,853 B2 * | 6/2007 | Kwon et al. | ........... | 365/185.22 |
| 2003/0081460 A1 * | 5/2003 | Choi et al. | ............. | 365/185.29 |
| 2003/0223272 A1 * | 12/2003 | Mihnea et al. | .......... | 365/185.29 |
| 2005/0141284 A1 * | 6/2005 | Futatsuyama | .......... | 365/185.29 |
| 2006/0221708 A1 * | 10/2006 | Higashitani | ............ | 365/185.29 |
| 2007/0133306 A1 * | 6/2007 | Wang et al. | ............ | 365/185.29 |
| 2007/0183223 A1 * | 8/2007 | Aritome | ................ | 365/185.29 |
| 2007/0242525 A1 * | 10/2007 | Shen et al. | ............. | 365/185.29 |

FOREIGN PATENT DOCUMENTS

| | | |
|---|---|---|
| KR | 10-0190089 | 1/1999 |
| KR | 10-0204804 | 3/1999 |
| KR | 2002-0042756 | 6/2002 |

OTHER PUBLICATIONS

English language abstract for Korea Publication No. 10-0190089.
English language abstract for Korea Publication No. 10-0204804.
English language abstract for Korea Publication No. 2002-0042756.

* cited by examiner

*Primary Examiner*—Michael T Tran
(74) *Attorney, Agent, or Firm*—Marger Johnson & McCollom, P.C.

(57) ABSTRACT

A method of erasing data in a nonvolatile semiconductor memory device including applying an erase voltage to a substrate of the semiconductor memory device, applying a ground voltage to wordlines of a selected memory cell string formed in the substrate, and applying a control voltage to at least one of a string selection line and a ground selection line of the selected memory cell string.

9 Claims, 9 Drawing Sheets

METHOD OF ERASING DATA WITH IMPROVING RELIABILITY IN A NONVOLATILE SEMICONDUCTOR MEMORY DEVICE

CROSS-REFERENCE TO RELATED APPLICATIONS

This U.S. non-provisional patent application claims priority under 35 U.S.C. § 119 of Korean Patent Application 2005-106442 filed on Nov. 8, 2005, the entire contents of which are hereby incorporated by reference.

BACKGROUND

1. Field of the Invention

This disclosure is concerned with nonvolatile semiconductor memory devices, which in particular relates to a NAND-type nonvolatile semiconductor memory device with improved reliability by reducing a potential difference between the substrate and selection transistors during an erasing operation.

2. Discussion of Related Art

There are increasing demands for nonvolatile semiconductor memory devices that are electrically erasable and programmable and retain their data even without power supplies. Specifically, NAND-type nonvolatile semiconductor memory devices are widely used in portable information and communication apparatuses because they are capable of containing large quantities of data in limited sizes.

FIG. 1 is a cross sectional diagram showing the structure of a cell string ST in a conventional NAND-type semiconductor memory device. Referring to FIG. 1, in the cell string ST formed in a substrate 13 of p-well, a ground selection line (GSL) 31, a wordline WL of memory cells MCs, and a string selection line 33 are arranged in order between a common source line (CSL) 15 and a bitline (BL) 17.

In this structure, the ground selection line (GSL) 31 and the string selection line (SSL) 33, and adjacent structures form parasitic capacitances. In FIG. 1, the reference numerals C1, C2, and C3 denote capacitance values on the ground selection line (GSL) 31, which are formed with the substrate 13, the common source line (CSL) 15, and the wordline WL1, respectively. And, in FIG. 1, the reference numerals C1', C2', and C3' denote capacitance values on the string selection line (SSL) 33, which are formed with the substrate 13, the bitline (BL) 17, and the wordline WL32 respectively. Here, the capacitance values C1, C2 and C3 may be similar to the capacitance values C1', C2' and C3'.

FIG. 2 is a diagram showing voltage levels applied while erasing data in the conventional NAND-type nonvolatile semiconductor memory device, and other induced voltage levels. In FIG. 2, the solid lines depict the applied voltage levels while the broken lines depict the induced voltage levels.

Referring to FIGS. 1 and 2, an erasing voltage Vers is applied to the substrate 13 and a ground voltage VSS is applied to a wordline WLi of the cell string ST. A voltage Vers-Vbi≈Vers induced on the common source line (CSL) 15 and the bitline (BL) 17, with a forward-biasing current from the substrate 13 to an n+ region 41. Here, Vbi represents the built-in potential between the substrate 13 and the n+ region 41.

By the conventional method of erasing data, the ground selection line (SSL) 31 and the string selection line (SSL) 33 are conditioned in floating states. Thus, in the data erasing operation, the ground selection line (GSL) 31 and the string selection line (SSL) 33 are set to about βVers. As a result, the voltage difference about (1−β)Vers is established between the ground selection line (GSL) 31 and common source line (CSL) 15, and between the string selection line (SSL) 33 and the bitline (BL) 17. Here, β is (C1+C2)/(C1+C2+C3) or (C1'+C2')/(C1'+C2'+C3') for the ground selection line (GSL) 31 or the string selection line (SSL) 33, respectively.

As nonvolatile semiconductor memory devices become highly integrated, spatial distances between the ground selection line (GSL) 31 and wordline WL1 and between the string selection line (SSL) 33 and the wordline WL32, gradually become narrower. As a result, the capacitance values C3 and C3' become larger and the value of β, approaches 0.5. As a result, the electric fields between the ground selection line (GSL) 31 and common source line (CSL) 15, and between the string selection line (SSL) 33 and the bitline (BL) 17 are increased.

Accordingly, with the conventional method of erasing data in the NAND-type nonvolatile semiconductor memory device, a breakdown effect in insulation films between the ground selection line (GSL) 31 and the common source line (CSL) 15 and between the string selection line (SSL) 33 and the bitline (BL) 17 may occur. Further, the breakdown effect may occur in insulation films between the substrate and the selection lines GSL and SSL. As a result, the conventional method of erasing data is disadvantageous because it may degrade the reliability of erasing operation in the device.

SUMMARY OF THE INVENTION

An embodiment includes a method of erasing data in a nonvolatile semiconductor memory device including applying an erase voltage to a substrate of the semiconductor memory device, applying a ground voltage to wordlines of a selected memory cell string formed in the substrate, applying a control voltage to at least one of a string selection line and a ground selection line of the selected memory cell string, floating wordlines of a deselected memory cell string formed in the substrate and floating at least one of a string selection line and a ground selection line of the deselected memory cell string.

Another embodiment includes a method of erasing data in at least one selected memory cell string of a nonvolatile semiconductor memory device including applying an erase voltage to a substrate of the semiconductor memory device, floating wordlines of a deselected memory cell string formed in the substrate, floating at least one of a string selection line and a ground selection line of the deselected memory cell string, applying a ground voltage to wordlines of a selected memory cell string formed in the substrate, and applying a control voltage to at least one of a string selection line and a ground selection line of the selected memory cell string.

A further embodiment includes a nonvolatile semiconductor memory device including a substrate, a memory cell string formed in the substrate, the memory cell string having a plurality of wordlines, a string selection line, and a ground selection line, and a block selection circuit configured to apply a control voltage to at least one of the string selection line and the ground selection line during an erase operation if the memory cell string is selected, wherein the block selection circuit is further configured to float to at least one of the string selection line and the ground selection line during an erase operation if the memory cell string is deselected.

BRIEF DESCRIPTION OF THE DRAWINGS

The accompanying drawings are included to provide a further understanding of the invention, and are incorporated in and constitute a part of this specification. The drawings illustrate embodiments and, together with the description, serve to explain principles of the invention. In the drawings.

DETAILED DESCRIPTION OF PREFERRED EMBODIMENTS

Embodiments of the invention will be described below in more detail with reference to the accompanying drawings. The invention may, however, be embodied in different forms and should not be construed as limited to the embodiments set forth herein. Rather, these embodiments are provided so that this disclosure will be thorough and complete, and will fully convey the scope of the invention to those skilled in the art. Like numerals refer to like elements throughout the specification.

Figure 3A:
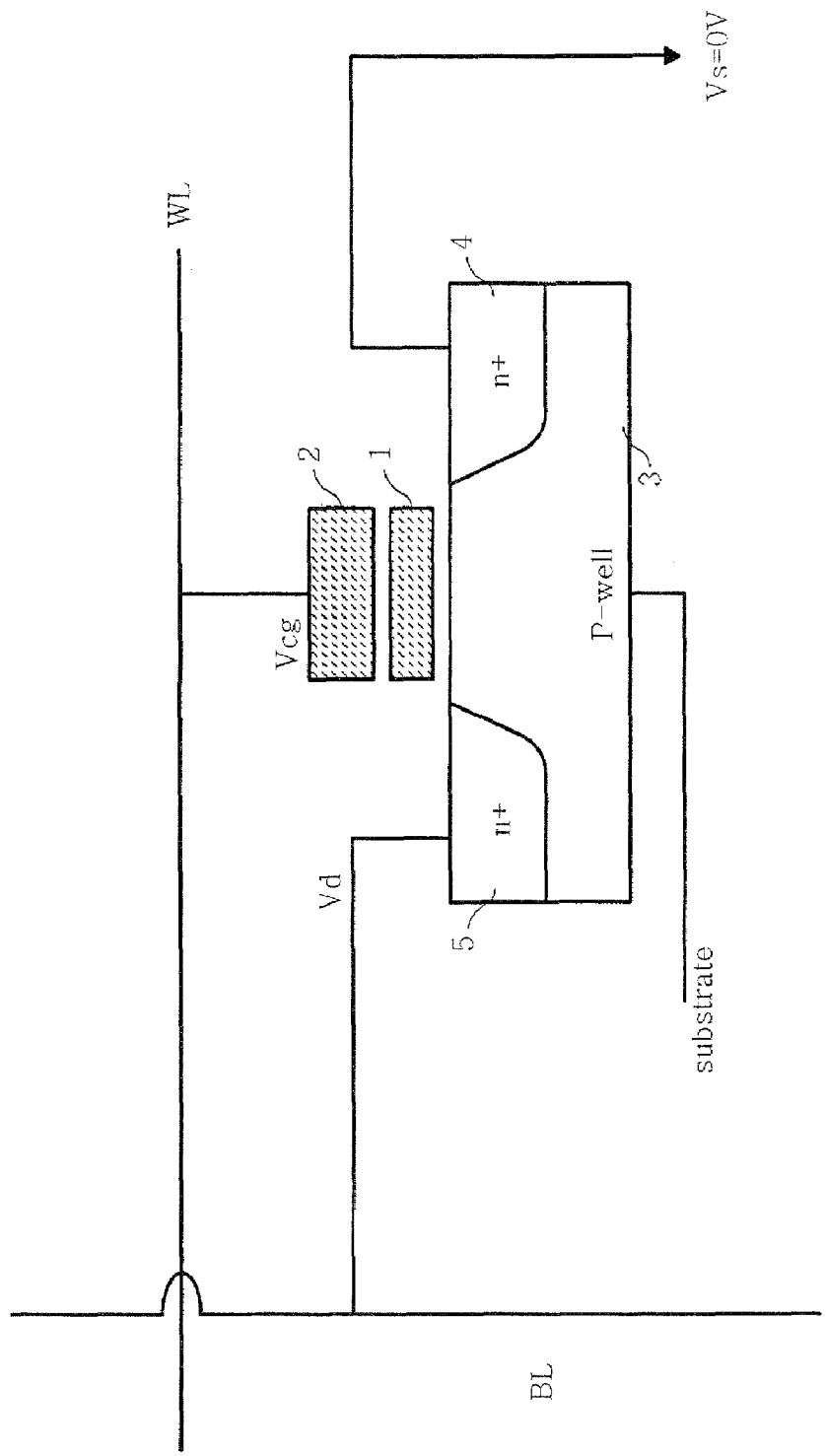
FIGS. 3A through 3C are schematic diagrams showing a structure of a nonvolatile memory cell, an equivalent circuit of the nonvolatile memory cell, and a characteristic of threshold voltage in the nonvolatile memory cell, respectively.
Figure 3B:
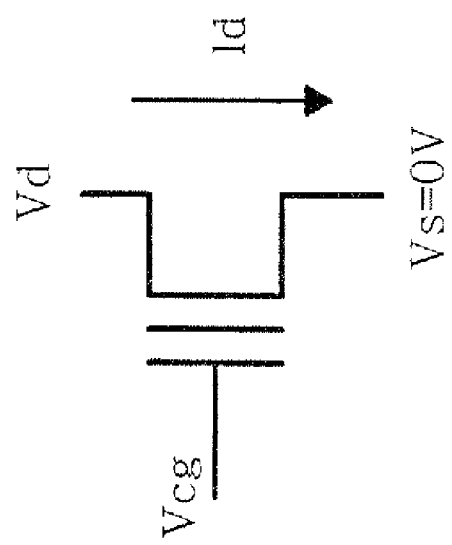
Figure 3C:
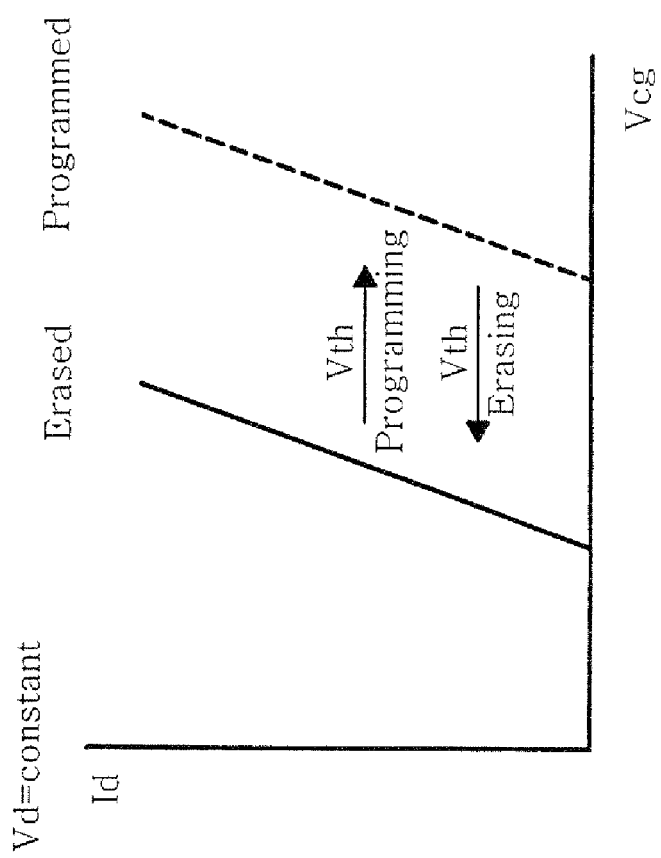

Before describing the embodiments, theoretical concepts of operation in a memory cell adaptable to the nonvolatile semiconductor memory device will be explained, FIG. 3A shows a typical structure of a nonvolatile memory cell, FIG. 3B illustrates an equivalent circuit of the nonvolatile memory cell, and FIG. 3C illustrates a characteristic of threshold voltage in the nonvolatile memory cell.

Referring to FIGS. 3A through 3C altogether, a unit memory cell includes a source region 4 and a drain region 5 which are disposed in a substrate 3. In this example, the substrate 3 is formed in P-type conductivity and the source and drain regions, 4 and 5, are formed in N+ type conductivity. A gate structure is arranged over a channel region confined in the space between the source region 4 and the drain region 5. The gate structure includes a floating gate 1 and a control gate 2. Although not shown, a tunneling dielectric layer is interposed between the floating gate 1 and the surface of the substrate 3, and another dielectric layer (or a control dielectric layer) is interposed between the floating gate 1 and the control gate 2. In these figures, a drain voltage Vd is supplied from a bitline BL, a control gate voltage Vcg is supplied from a wordline WL, and a source voltage Vs is connected to a reference potential such as a ground voltage.

A threshold voltage of the memory cell defines logical values stored therein. If the memory cell is in an erased state, the threshold voltage Vt is relatively lower as shown in FIG. 3A. Otherwise, if the memory cell is in a programmed state, the threshold voltage Vt is relatively higher.

Converting the memory cell from the programmed state to the erased state may use a well-known physical mechanism called Fowler-Nordheim (F-N) tunneling effect. The F-N tunneling effect proceeds as follows. When a relatively large positive (+) voltage difference is generated between the control gate 2 and the substrate 3, excited electrons are transmitted through the channel on the substrate 3 and trapped in the floating gate 1. Such negatively charged electrons act as a potential barrier, raising the threshold voltage as illustrated in FIG. 3C.

When converting the memory cell from the erased state to the programmed state, a large negative (−) potential difference is formed between the control gate 2 and the substrate 3 and thereby the memory cell can be recovered to the erased state. The F-N tunneling effect resulting from the bias condition makes the trapped electrons return to the substrate 3 crossing the tunneling dielectric layer, removing the potential barrier and dropping the threshold voltage Vth.

Figure 4:
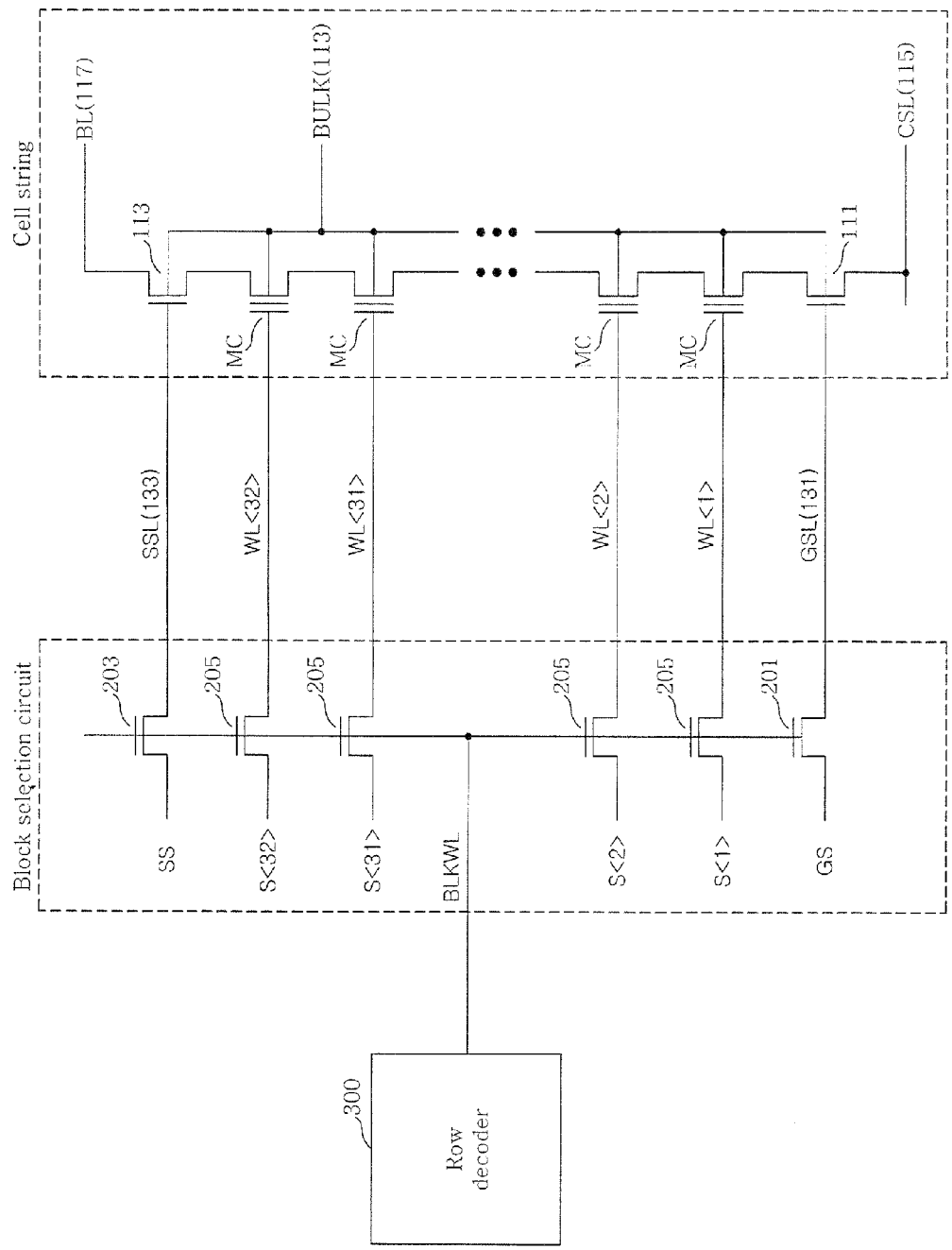
FIG. 4 is a circuit diagram partially illustrating a nonvolatile semiconductor memory device employing a method of erasing data in accordance with an embodiment.

FIG. 4 is a circuit diagram partially illustrating a nonvolatile semiconductor memory device employing a method of erasing data in accordance with an embodiment. The nonvolatile semiconductor memory device includes cell strings ST and block selection circuits BKSEL.

FIG. 4 shows an example of a unit cell string ST and a corresponding unit block selection circuit BKSEL, but other corresponding cell strings and block selection circuits corresponding to them are not illustrated. This is because the other cell strings and block selection circuits have similar structures and, for convenience, the descriptions are omitted. This omission does not limit the scope of the invention.

Figure 1:
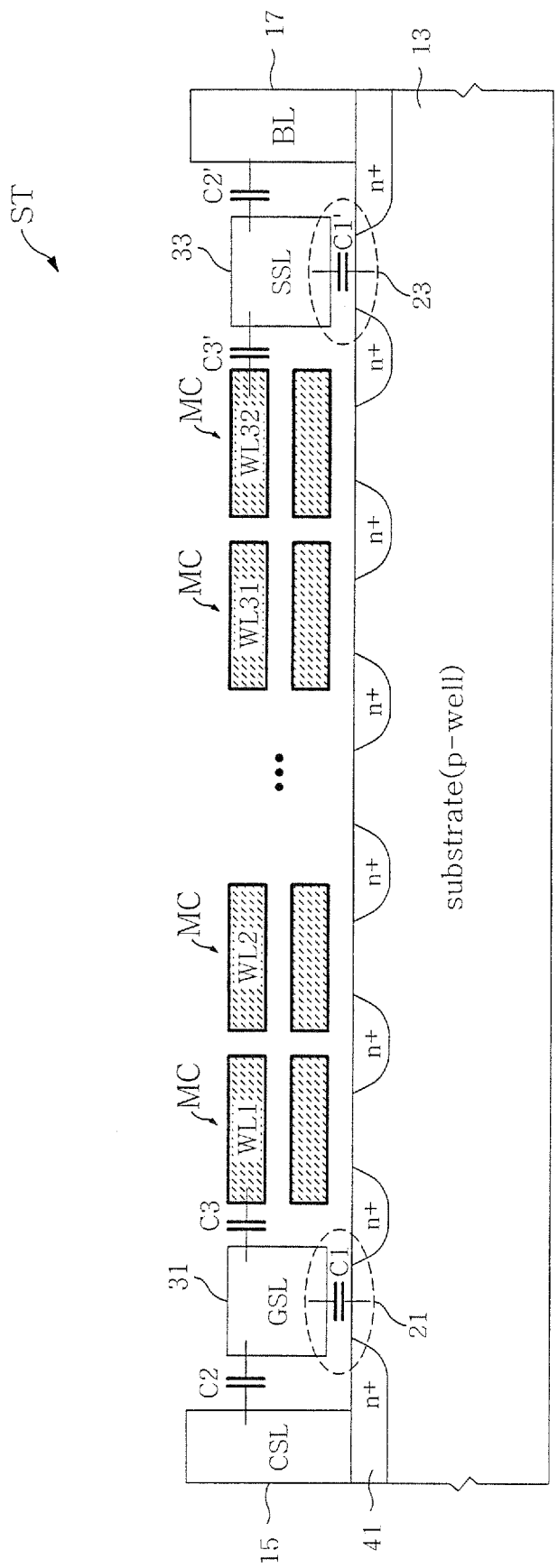
FIG. 1 is a cross sectional diagram showing a cell string structure of a conventional NAND-type semiconductor memory device.
Figure 2:
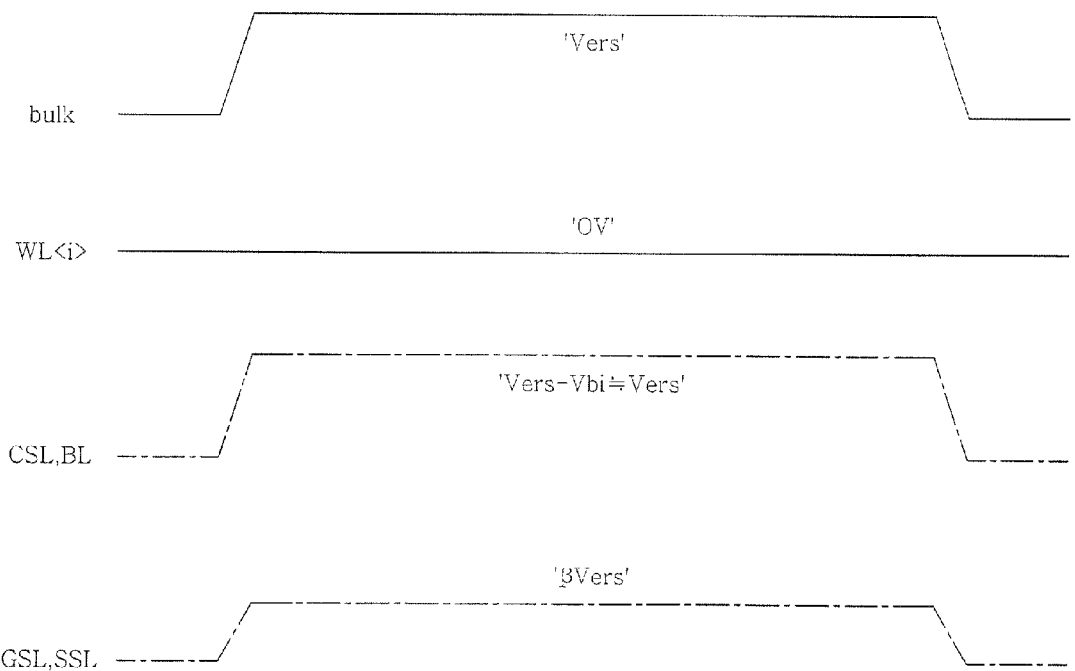
FIG. 2 is a diagram showing voltage levels applied during erasing data in the conventional NAND-type nonvolatile semiconductor memory device, and other induced voltage levels.
Figure 5:
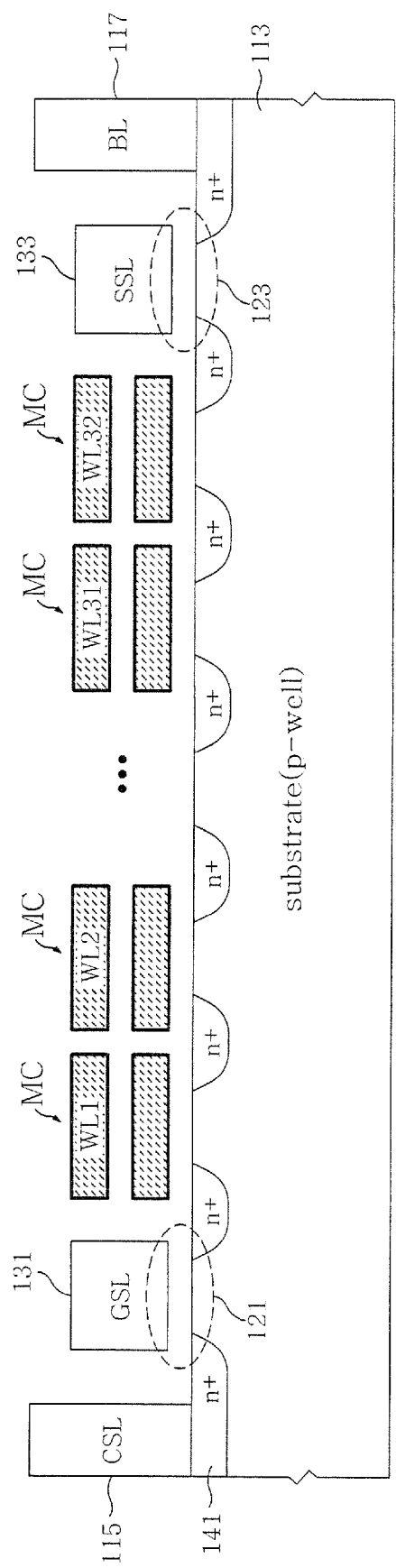
FIG. 5 is a diagram illustrating a vertical structure of the cell string ST shown in FIG. 4.

FIG. 5 is a diagram illustrating a vertical structure of the cell string ST shown in FIG. 4, being implemented as like the pattern of the cell string ST shown in FIG. 2.

Referring to FIGS. 4 and 5, the cell string ST is formed in a substrate 113. In this embodiment, the substrate 113 is implemented with a P-well containing P-type impurities. The cell string ST includes a common source line (CSL) 115, a bitline (BL) 117, a ground selection transistor 121, memory cells MCs, and a string selection transistor 123. The ground selection transistor 121, the memory cells MCs, and the string selection transistor 123 are serially arranged between the common source line (CSL) 115 and the bitline (BL) 117.

A gate of the ground selection transistor 121 is connected to a ground selection line (GSL) 131, and a gate of the string selection transistor 123 is connected to a string selection line (SSL) 133. And, a control gates of the memory cells MC are connected to wordlines WL1~ WL32, respectively.

As illustrated in FIG. 4, the block selection circuit BKSEL includes a ground transmission transistor 201, a string transmission transistor 203, and wordline transmission transistors 205. The ground transmission transistor 201 and the string transmission transistor 203 are each connected to the ground selection line (GSL) 131 and the string selection line (SSL) 133 respectively. The wordline transmission transistors 205 are connected to the wordlines WL.

The ground transmission transistor 201 and the string transmission transistor 203 transfer a string selection signal SS and a ground selection signal GS to the ground selection line (GSL) 131 and the string selection line (SSL) 133, respectively, in response to a block selection signal BLKWL provided from a row decoder 300. The wordline transmission transistors 206 transfer wordline signals S<1:32> to their corresponding wordlines WL<1:32> respectively in response to the block selection signal BLKWL.

Figure 6:
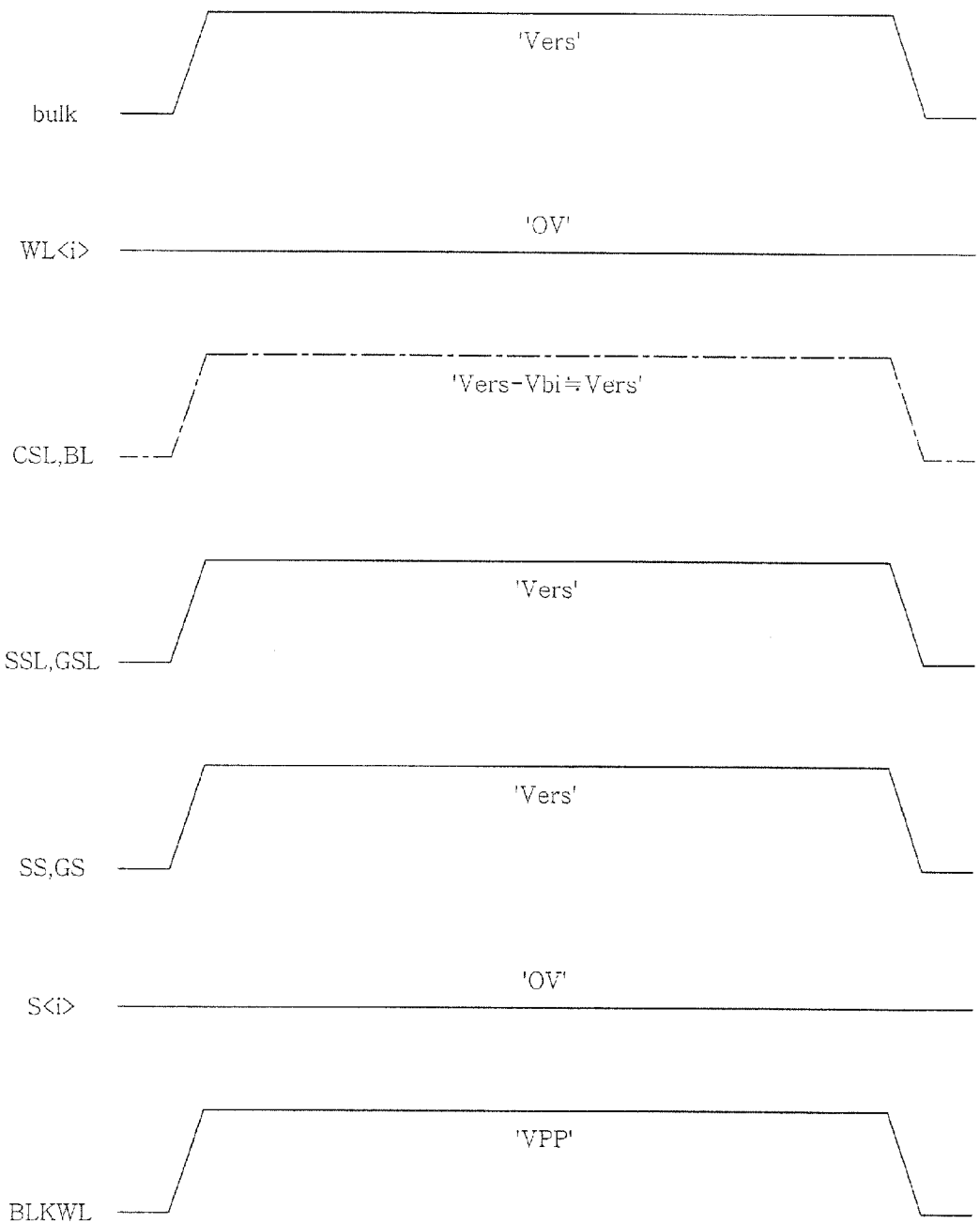
FIG. 6 is a diagram illustrating voltage levels at leading nodes or terminals relevant to a cell string selected during the erasing of data in the NAND-type nonvolatile semiconductor memory device in accordance with an embodiment.

FIG. 6 is a diagram illustrating voltage levels at leading nodes or terminals relevant to a cell string selected during the erasing of data in the NAND-type nonvolatile semiconductor memory device in accordance with an embodiment. In FIG. 6, the solid lines depict voltage levels of the applied signals while the broken lines depict voltage levels of the induced signals.

Referring to FIGS. 5 and 6, an erasing voltage Vers is applied to the substrate 113 and a ground voltage VSS is applied to the wordline WLi of the cell string ST. Thereby, on the common source line (CSL) 115 and the bitline (BL) 117, a voltage Vers-Vbi≈Vers is induced by a forward-biasing current from the substrate 113 to an n+ region 141. Here, Vbi represents the built-in potential between the substrate 113 and the n+ region 141.

The ground selection line (GSL) 131 and the string selection line (SSL) 133 are controlled by a predetermined 'control voltage.' Preferably, the control voltage is near to the erasing voltage, more preferably being the erasing voltage Vers applied to the substrate 113.

As such, to provide the erasing voltage Vers to the ground selection line (GSL) 131 and the string selection line (SSL) 133, the string selection signal SS and the ground selection signal GS are also set to the erasing voltage Vers. The wordline signals S<1:32> are set to the ground voltage VSS. In order to provide the erasing voltage Vers, from the string selection signal SS and the ground selection signal GS to the ground selection line (GSL) 131 and the string selection line (SSL) 133 without a voltage drop, the block selection signal BLKWL is set to a boosted voltage VPP.

Here, the boosted voltage VPP is set at least over a voltage level higher than the erasing voltage Vers by a threshold voltage of the ground transmission transistor 201, the string transmission transistor 203, or the wordline transmission transistor 205.

When the ground selection line (GSL) 131 and the string selection line (SSL) 133 are set to the erasing voltage Vers, the voltage differences between the ground selection line (GSL) 131 and the common source line (CSL) 115 and between the string selection line (SSL) 133 and the bitline (BL) 117 are almost 0V. Accordingly, the probability of generating the breakdown effects described above in insulation films between the ground selection line (GSL) 131 and the common source line (CSL) 115 and between the string selection line (SSL) 133 and the bitline (BL) 117 is remarkable reduced.

Furthermore, the voltage differences between the substrate and the selection lines also approach 0V. Thus, the probability of the insulation-film breakdown effect between the substrate and the selection lines GSL and SSL is highly reduced, improving the reliability of the nonvolatile semiconductor memory device.

Figure 7:
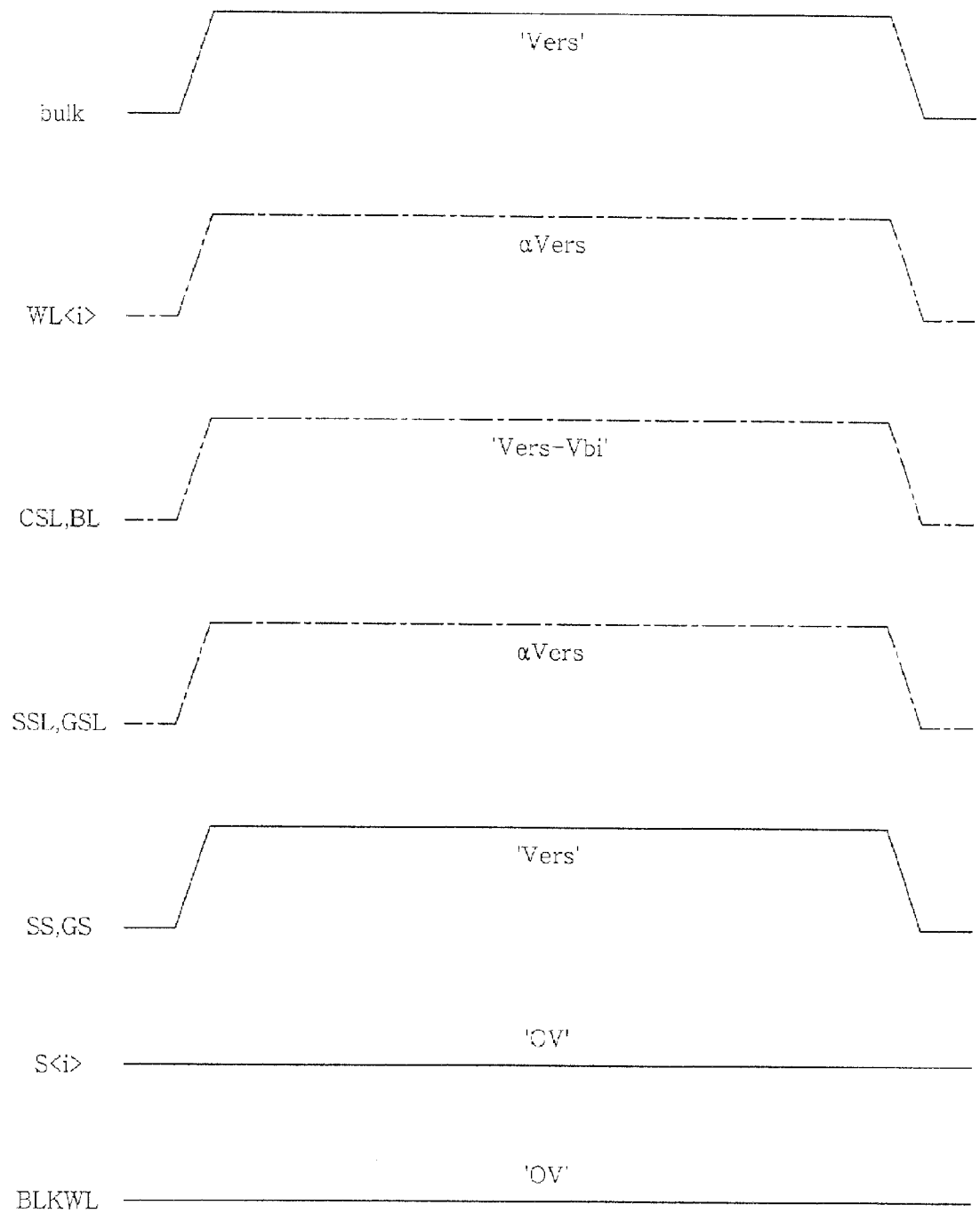
FIG. 7 is a diagram illustrating voltage levels at leading nodes or terminals relevant to a cell string deselected during the erasing of data in the NAND-type nonvolatile semiconductor memory device in accordance with an embodiment.

FIG. 7 is a diagram illustrating voltage levels at leading nodes or terminals relevant to a cell string deselected during erasing data in the NAND-type nonvolatile semiconductor memory device in accordance with an embodiment. In FIG. 7, the solid lines depict voltage levels of the applied signals while the broken lines depict voltage levels of the induced signals.

Referring to FIG. 7, the block selection signal BLKWL corresponding to the deselected cell string ST is controlled to the ground voltage VSS. In this case, although voltage levels of the ground selection signal GS and the string selection signal SS rise up to the erasing voltage Vers, the ground selection line (GSL) 131 and the string selection line (SSL) 133 of the deselected cell string ST remain in floating states. Wordlines WLi of the deselected cell string ST are also conditioned in floating states.

During this operation, if the erasing voltage Vers is applied to the substrate 113, the wordline WLi is coupled to the substrate 113 and then goes to the voltage level of α Vers. Here, α is almost 1. Accordingly, as a potential difference between the wordline WLi and the substrate 113 becomes almost 0, there is no effect of erasing data.

The ground selection line (GSL) 131 and the string selection line (SSL) 133 are also coupled to the substrate 1113, and go to the voltage level of α Vers.

As a result, the voltage differences between the ground selection line (GSL) 131 and the common source line (CSL) 115 and between the string selection line (SSL) 133 and the bitline (BL) 117 approach 0V. And, the voltage differences between the substrate and the selection lines GSL and SSL also approaches 0V.

As stated above, in the method of erasing data in the nonvolatile semiconductor memory device, the ground selection line GSL and string selection line SSL are set to the erasing voltage Vers. Thus, the voltage differences between the ground selection line GSL and the common source line CSL and between the string selection line SSL and the bitline BL become almost 0V. In addition, the voltage differences between the substrate and the selection lines GSL and SSL also approach 0V.

Accordingly, the probability of generating the breakdown effects at insulation films between the ground selection line GSL and the common source line CSL and between the string selection line SSL and the bitline BL 117 is remarkable reduced. Further, the probability of the insulation-film breakdown effect is highly reduced between the substrate and the selection lines GSL and SSL.

Therefore, the overall reliability in erasing data in the nonvolatile semiconductor memory device is highly improved.

Although embodiments have been described in connection with the accompanying drawings, it is not limited to these embodiments. It will be apparent to those skilled in the art that various substitutions, modifications, and changes may be thereto without departing from the scope and spirit of the invention as detailed by the following claims.

What is claimed is:

1. A method of erasing data in a nonvolatile semiconductor memory device comprising:

applying an erase voltage to a substrate of the semiconductor memory device;

applying a ground voltage to wordlines of a selected memory cell string formed in the substrate;

applying a control voltage to at least one of a string selection line and a ground selection line of the selected memory cell string;

floating wordlines of a deselected memory cell string formed in the substrate; and floating at least one of a string selection line and a ground selection line of the deselected memory cell string.

2. The method of claim 1, wherein applying the control voltage further comprises applying the control voltage to the string selection line and the ground selection line of the selected memory cell string.

3. The method of claim 1, wherein applying the control voltage further comprises applying the erase voltage to the at least one of the string selection line and the ground selection line of the selected memory cell string.

4. The method of claim 1, wherein floating the at least one of the string selection line and the ground selection line of the deselected memory cell string further comprises floating the string selection line and the ground selection line of the deselected memory cell string.

5. A nonvolatile semiconductor memory device comprising:
   a substrate;
   a memory cell string formed in the substrate, the memory cell string having a plurality of wordlines, a string selection line, and a ground selection line; and
   a block selection circuit configured to apply a control voltage to at least one of the string selection line and the ground selection line during an erase operation if the memory cell string is selected, wherein the block selection circuit is further configured to float to at least one of the string selection line and the ground selection line during an erase operation if the memory cell string is deselected.

6. The nonvolatile semiconductor memory device of claim 5, wherein the control voltage is an erase voltage.

7. A method of erasing data in a nonvolatile semiconductor memory device comprising:
   applying an erase voltage to a substrate of the semiconductor memory device;
   applying a ground voltage to wordlines of a selected memory cell string formed in the substrate;
   applying a control voltage to at least one of a string selection line and a ground selection line of the selected memory cell string through a transistor directly connected to the at least one of the string selection line and the ground selection line;
   floating wordlines of a deselected memory cell string formed in the substrate; and
   floating at least one of a string selection line and a ground selection line of the deselected memory cell string.

8. The method of claim 7, wherein applying the control voltage to at least one of the string selection line and the ground selection line comprises:
   applying a string select signal having the control voltage to the transistor; and
   switching the transistor to apply the string select signal to the string select line.

9. The method of claim 7, wherein applying the control voltage to at least one of the string selection line and the ground selection line comprises:
   applying a ground select signal having the control voltage to the transistor; and
   switching the transistor to apply the ground select signal to the ground select line.

* * * * *

UNITED STATES PATENT AND TRADEMARK OFFICE
CERTIFICATE OF CORRECTION

PATENT NO.       : 7,403,429 B2                                               Page 1 of 1
APPLICATION NO.  : 11/548630
DATED            : July 22, 2008
INVENTOR(S)      : Dong-Hyuk Chae et al.

It is certified that error appears in the above-identified patent and that said Letters Patent is hereby corrected as shown below:

Column 6, line 11, the word "1113" should read -- 113 --.

Signed and Sealed this

Sixteenth Day of December, 2008

JON W. DUDAS
*Director of the United States Patent and Trademark Office*